United States Patent [19]

Brüggemann

[11] Patent Number: 4,701,867

[45] Date of Patent: Oct. 20, 1987

[54] ELECTRICAL TESTING DEVICE FOR A VEHICLE COMBINATION INSTRUMENT

[75] Inventor: Ulrich Brüggemann, Oberursel, Fed. Rep. of Germany

[73] Assignee: VDO Adolf Schindling AG, Frankfurt am Main, Fed. Rep. of Germany

[21] Appl. No.: 648,546

[22] Filed: Sep. 7, 1984

[30] Foreign Application Priority Data

Sep. 8, 1983 [DE] Fed. Rep. of Germany ....... 3332386

[51] Int. Cl.$^4$ .................. G06G 7/48; G01R 15/12
[52] U.S. Cl. .................. 364/550; 324/73 AT; 340/515; 364/578; 364/580; 371/25
[58] Field of Search ............... 364/424, 483, 550, 578, 364/580; 371/25, 28; 324/73 AT; 340/515, 516

[56] References Cited

U.S. PATENT DOCUMENTS

| 4,055,801 | 10/1977 | Pike et al. ............... 324/73 AT X |
| 4,118,688 | 10/1978 | Glennon ............... 340/516 |
| 4,207,610 | 6/1980 | Gordon ............... 364/483 X |
| 4,300,205 | 11/1981 | Tansuwan ............... 364/424 X |
| 4,339,801 | 7/1982 | Hosaka et al. ............... 364/431.04 |
| 4,433,413 | 2/1984 | Fasang ............... 371/25 |
| 4,517,839 | 5/1985 | Van Dyke ............... 324/73 AT X |
| 4,539,641 | 9/1985 | Kawashimo et al. ............... 364/550 X |
| 4,554,636 | 11/1985 | Maggi et al. ............... 324/73 AT X |

Primary Examiner—Errol A. Krass
Assistant Examiner—Kevin J. Teska
Attorney, Agent, or Firm—Martin A. Farber

[57] ABSTRACT

An electric testing device is provided for the final testing of vehicle combination instruments. The vehicle combination instruments comprise display means (1-7) consisting of segments, a display control in a microcomputer (8) for activating the segments as a function of measured values, for analog measured values an analog-digital converter (14) arranged in front of the display control, and possibly an input network (13) arranged in front of said converter. The testing device and combination instruments are intended for final testing in a plurality of final test phases. Tolerance values of a critical display value are stored for each measurement value in the microcomputer (8). These tolerance values can be compared, in a first final test phase of a manually actuatable final-test operating mode, with a simulated measurement value which is fed into the microcomputer via the analog-digital converter and possibly the resistance network. A display value which represents the result of the comparison and is also fed into the microcomputer is transmitted, as a function of the result of the comparison, to the display means (3). Predetermined segment combinations can then be activated in succession by the display control in further final-test phases by operating a switch of the testing device. In the latter, there are provided equivalent resistors (35-37) which simulate the measurement value, as well as switches (33, 34) for calling up the final-test operating mode and for the further switching of the final-test phases.

9 Claims, 8 Drawing Figures

ELECTRICAL TESTING DEVICE FOR A VEHICLE COMBINATION INSTRUMENT

FIELD AND BACKGROUND OF THE INVENTION

The invention relates to an electric testing device for a vehicle combination instrument in general.

In particular, the invention relates to an electric testing device for vehicle combination instruments which comprises display means consisting of segments, a display control in a microcomputer for activating the segments as a function of measured values, for analog values an analog-digital converter arranged in front of the display control, and possibly an input network arranged in front of said converter.

In the prior-art testing of analog-display pointer instruments for vehicles, and particularly automotive vehicles, the pointer instrument is acted on by a given signal corresponding to a simulated measured value and it is determined whether a corresponding display value is obtained.

Vehicle combination instruments with display means consisting of segments formed in particular by liquid crystals cannot be readily tested in this way. In this case, the switch points of the segments must be tested at given measurement values. If the measurement values are represented by resistances of a resistance transmitter for the measurement of the level of the tank, the temperature or the pressure, the testing must traditionally be effected with highly precise resistance decades which are connected to the inputs of the vehicle combination instrument instead of at the measurement transmitters. A testing device having such highly precise resistance decades, which furthermore must be resistant to aging and dimensioned for relatively high loss power, is, however, expensive. Aside from this, the final testing of the vehicle combination instruments which is to be carried out with such a testing device after the instruments have been manufactured is cumbersome and time-consuming, due to the setting of the decades and to the fact that, as a result of the damping provided on many indications of the vehicle combination instrument, it is necessary to wait a considerable amount of time after each change in the adjustment before the display in question can be evaluated.

Furthermore, this resistance-decade testing device is not suitable for reliably detecting other defects in a vehicle combination instrument having display means consisting of segments, in particular to detect shunts between the segments, their control lines or driver connections. A segment will be activated by such a shunt even if, in a given configuration, the display is to remain inactive by the display control.

The object of the present invention, therefore, is to create an electric testing device for vehicle combination instruments which has the features indicated in the second introductory paragraph, is inexpensive and permits a rapid and dependable testing of input circuits with input networks and analog-digital converters as well as testing for undesired shunts of the individual segments.

SUMMARY OF THE INVENTION

This object is achieved by the invention in the manner that within the microcomputer (8) there are stored, for each measurement value, tolerance values of a critical display value which is compared, in a first final-test phase of a manually controllable final-test operating mode, with a simulated measurement value which can be fed into the microcomputer via the analog-digital converter (14) and possibly the resistance network (13), that a display value which represents the result of the comparison and is stored in the microcomputer (8) can be transferred to the display means (3) as a function of the result of the comparison; that by the display control, fixed, pre-determined segment combinations can be actuated one after the other in other manually controllable final-test phases in the test operating mode, that in the testing device (FIG. 2) equivalent resistors (35, 37) which simulate the measurement value as well as switches (33, 34) are provided to call up the final-test operating mode and for the further connecting of the final-test phases.

In accordance with the invention, in order to monitor the input circuit of the combination instruments for each measurement-value input which is to be connected to a resistance measurement transmitter after the subsequent installing of the combination instrument in the vehicle, an equivalent resistor which simulates a critical measurement value is connected for the final testing. In the microcomputer of each combination instrument, tolerance values or limit values are stored which, however, the equivalent resistance, in combination with the input circuit— input network and analog-digital converter—may reach but must not exceed. Since the equivalent resistance in the test device is fixed, it is possible in this way to note the properties of the input network of the analog-digital converter and other switch elements of the input circuit. Depending on the result of the comparison, namely whether the resistance value of the input circuits lies within the tolerances or not, the microcomputer transmits one of the stored characteristic display values to the display means.

The display values are preferably displayed as a number on the display means which are intended for the display of speed. The display value can, however, also be represented in other fashion, for instance in case of error by the blinking of the corresponding display segments.

In the final-test phase described, it was therefore determined whether the bit combinations for the simulated measurement resistances which are called for by the analog-digital converter are greater than, less than, or—as desired—somewhere between the maximum and minimum limit values which are stored in the microcomputer. In this way, the converter error as well as errors of the series-connected resistor network are detected in addition to the tolerance of the resistor which simulates the transmitter. By further manual actuation of a switch of the testing device, any shunts of the segments, segment control lines and driver connections are detected. For this purpose, fixed pre-determined segment combinations are activated one after the other by the display control in several final test phases. Combinations are activated such that, in case of proper operation, they can be easily recognized by an examiner and that two segments or segment paths which lie alongside of each other are never acted on by a signal of the same phase.

Three segment combinations which are obtained in different final-test phases have proven to be particularly easy to note by the examiner:

1. All odd-numbered segments for rpm display means in the manner of a bar graph display as well as the horizontal segments of a digital speed display are activated.

2. All even-numbered segments of the rpm display means, the upper vertical segments of the speed display and the km/h unit are activated.

3. The remaining lower segments of the speed display and all other measurement units, symbols and legends of the combination instrument are activated.

After the completion of these final-test phases the microcomputer of the combination instrument, in combination with a monitoring circuit, can be automatically switched internally to normal operating mode. In this normal operating mode, which, however, still forms part of the final test, the pulses preferably derived from a power frequency can be fed by pulse generators from the testing device as distance pulses and rpm pulses into the combination instrument. In the normal operating mode, the display indicia for the rpm display move up in the manner of a bar graph and show odometer increments.

Thereafter, the course of the program commences again in the microcomputer and the testing process can, if necessary, be repeated.

Furthermore, in accordance with the invention, there are provided in the testing device (FIG. 2), pulse generators (30, 31, 32) for odometer pulses and rpm pulses, which can be fed in the microcomputer (8) for the testing of the odometer (2) and of the tachometer (1) in the normal operating mode of the combination instrument.

Furthermore, the microcomputer (8) of the combination instrument together with a monitoring circuit (19) is capable of switching from the final-test operating mode to normal operating mode after a pre-determined number of final-test phases so that the testing of the odometer (2) and of the tachometer (1) then takes place.

Also according to the invention, at least one display value which represents the result of the comparison can be represented as a number on the display means for the speed display (3).

Further, with the invention a number of display values (e.g. 0, 1, 2, 4, 8), which represent all comparison results obtained during a final-test phase, can be represented as a sum.

BRIEF DESCRIPTION OF THE DRAWINGS

With the above and other objects and advantages in view, the present invention will become more clearly understood in connection with the detailed description of a preferred embodiment, when considered with the accompanying drawings, of which.

DETAILED DESCRIPTION OF THE PREFERRED EMBODIMENT

Figure 1:
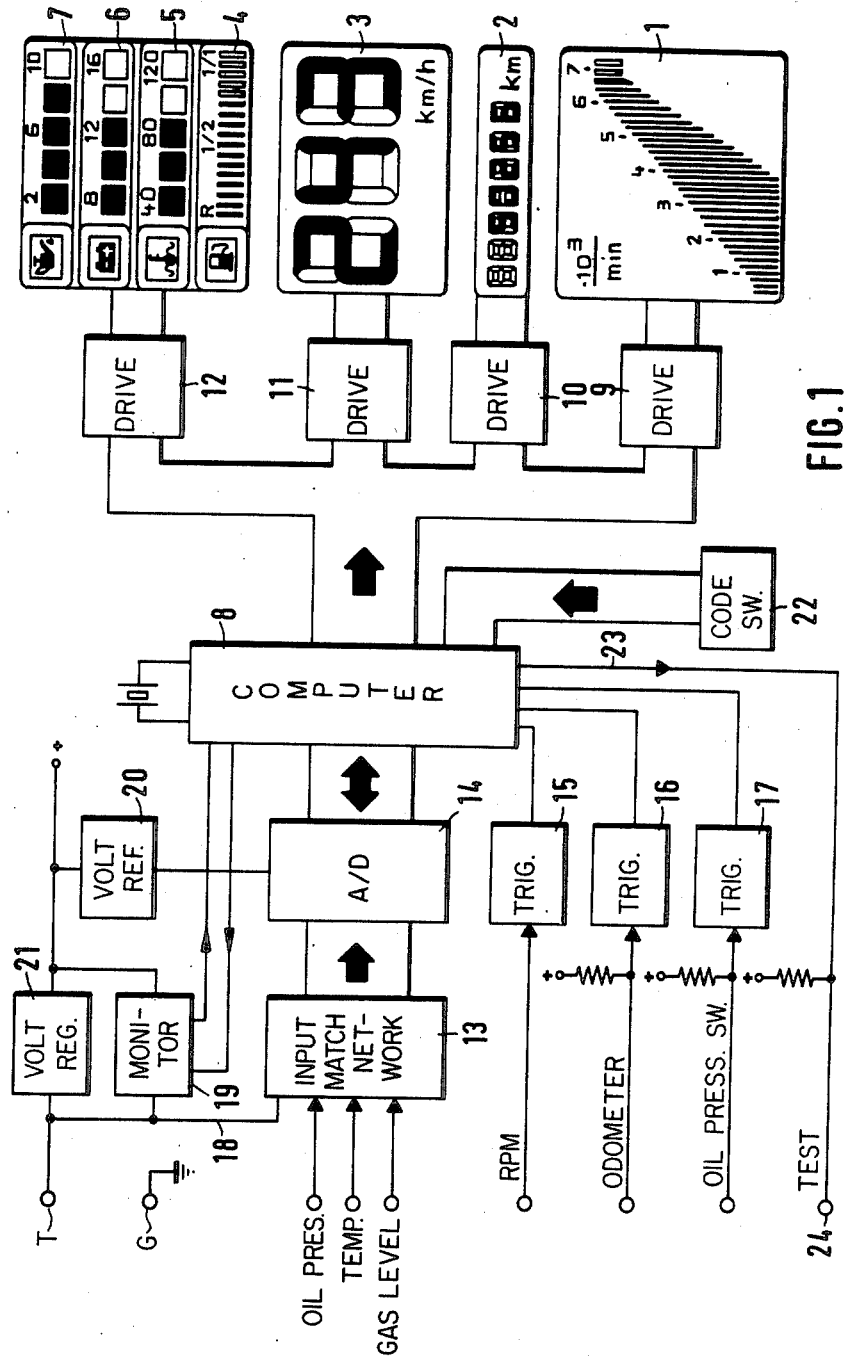
FIG. 1 shows the electronic combination instrument to be subjected to final testing, seen in the form of a block diagram.

In accordance with FIG. 1, the display device includes a bar graph display 1 to display the revolutions per minute of a motor engine, an odometer 2, the speed or tachometer display 3, as well as four indicators 4-7 for gasoline level, water temperature, battery voltage and oil pressure, developed by segments or in the manner of a bar graph display.

All displays, including the indications of the dimensions and the symbols for the measurement values are developed with liquid crystals.

The segments of these liquid crystals are controlled from a microcomputer 8 by drivers 9-12.

The activating of the display means shown is effected in accordance with the measurement values which are fed into the microcomputer for the gasoline level, the water temperature, the oil pressure and the voltage, via a matching input network 13 and an analog-digital converter 14. The measurement variables for the speed of rotation, distance and speed are fed via a Schmitt-Trigger and monoflop 15 or via a Schmitt trigger 16 into the microcomputer.

A signal from an oil-pressure switch is fed via a Schmitt trigger 17 to the microcomputer. Furthermore, the microcomputer is controlled from terminal T via a line 18, the input network 13 and the analog-digital converter 14. The microcomputer can thus initially, after the turning on of the ignition, be operated in a test phase in the test operating mode in which all segments of the display means 1-7 are activated in order to show the driver that all segments, particularly those of the warning functions, are operating properly. The segments of the speed display are, in this connection, shown in two sections, namely first of all in a characteristic smaller number and then with a second number which indicates all usable segments as sequence of digits, i.e. 288 (in which, in the digit 2, there can be activated, in addition, a segment of the "1" depiction).

For example, by the oil-pressure switch, early switching can be effected from this test phase into the mode of operation for the depiction of the actual measurement values.

The display device furthermore includes a watch-dog monitoring circuit 19, which monitors the proper course of the program of the microcomputer 8, and, if it is not proper, resets the microcomputer. For the operation of the analog-digital converter, a reference voltage source 20 is provided.

The watch-dog circuit and the reference voltage source are fed by a voltage regulator 21.

Furthermore, the display device includes coding switches 22, which serve as switch means for scaling the microcomputer upon the processing of rpm pulses to the specific type of engine.

Finally, there is provided a line 23, which extends out of the microcomputer and provides a connection 24 for the carrying out of a workshop test.

Figure 2:
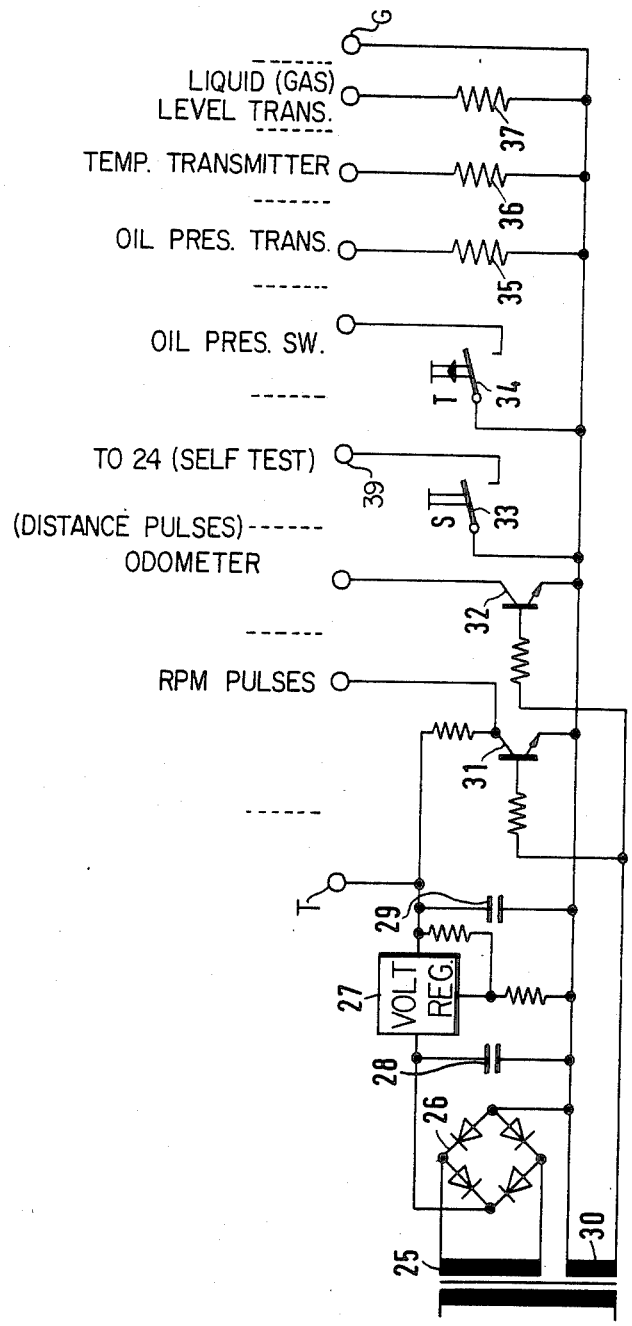
FIG. 2 is a circuit diagram of the testing device suitable for the final-test of the combination instrument.

For the final-test of the combination instrument in FIG. 1, the terminals shown on the left in the drawing are not connected to the corresponding connections of a vehicle, in particular the transmitters, but are to be connected, for the final testing, to correspondingly designated terminals of the testing device according to FIG. 2.

The testing device comprises a power pack having a transformer 25, a rectifier 26, a voltage regulator 27 and filter capacitors 28, 29 which gives off a controlled voltage of 13.5 volts to a terminal which corresponds to the terminal T in FIG. 1.

One winding 30 of the transformer 25 serves to control transistors 31, 32, which form a pulse generator for rpm pulses and odometer pulses, respectively. The rpm pulses and odometer pulses can be tapped off at correspondingly designated terminals.

Furthermore, the testing device comprises a switch 33 which can be connected to the connection 24 in FIG.

1 and switches the microcomputer to the final-test operating mode.

A feeler 34 lies against the connection for the oil-pressure switch, which connection is otherwise without function in this test operating phase, in order manually to control the individual final-test phases in the microcomputer 8.

The testing device furthermore comprises highly precise equivalent resistors 35-37 which replace resistance transmitters for oil pressure, temperature and gas level. A final terminal—terminal G, to use the terminology customary in automobile electrical systems—serves to connect the ground wire to the combination instrument.

A test program is programmed into the microcomputer for the final testing. The test program comprises the maximum and minimum values for the simulated measurement values of oil pressure, temperature and gasoline level. The final test can be initiated on a pin 39 which is connected to the connection 24. By means of a further pin on the microcomputer, which is provided, after installation of the combination instrument, for the oil-pressure switch, the feeler 34 is connected for the further switching of the individual final-test phases. The organization of the microcomputer for the individual final-test phases can be noted from the above general description and from the test course described below. The microcomputer, however, is set up in such a manner that after a pre-determined final-test phase, the microcomputer does not give off any pulse to the watch-dog circuit 19, so that this watch-dog circuit, by means of a reset pulse, switches the microcomputer into the normal operating mode in which—still during the final testing—the rpm pulses and odometer pulses formed by the transistors 31 and 32 are detected for test purposes and displayed.

First of all, the connections of the test instrument are connected to the connections of the same designation of the combination instrument so that, in particular, the ground connection is produced and the three equivalent resistors 35-37 replace the corresponding transmitter resistors. The supply voltage is then connected to the transformer 25. By actuating the switch 33, the pin 39 for the microcomputer is connected to ground. This connection must be present already at the time of the connecting of the combination instrument since the pin 39 is interrogated only once after the resetting of the microcomputer.

In this way, a subsequent noise signal is prevented from switching the microcomputer into the final-test operating mode.

The microcomputer now, during the first final-test phase, checks the inputs of the analog-digital converter to which the equivalent resistors 35-37 for the input network 13, are connected. If errors are found upon this checking of the input circuits, then their sum is indicated on the speed indicating means 3 by the digits 1-15 with the following ascription:

8=Oil pressure
4=Voltage
2=Temperature
1=Gasoline level
0=No error.

Figure 3A:
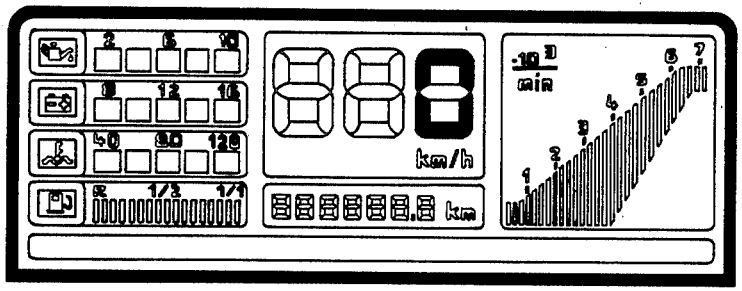
FIGS. 3a, 3b, 3c, 3d show the display means of the combination testing device in different final-test phases.
Figure 3B:
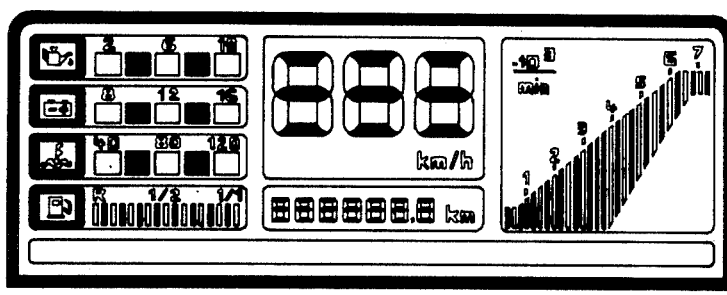

The test result "no error" is shown in FIG. 3a.

After the inputs of the analog-digital converter have been checked in the manner described, the individual further final-test phases can be switched further by the feeler 34:

Upon the first activation of the feeler 34, the first test picture is generated as segment combination in accordance with FIG. 3 in the microcomputer 8.

Figure 3C:
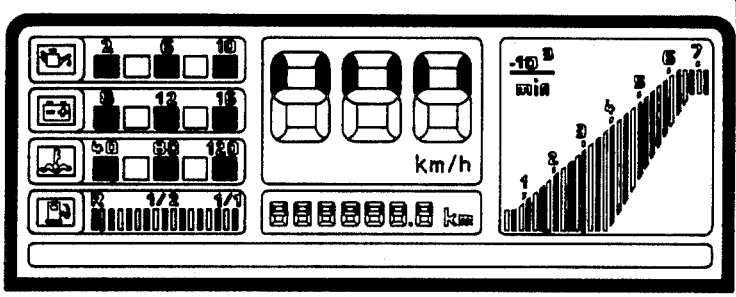
Figure 3D:
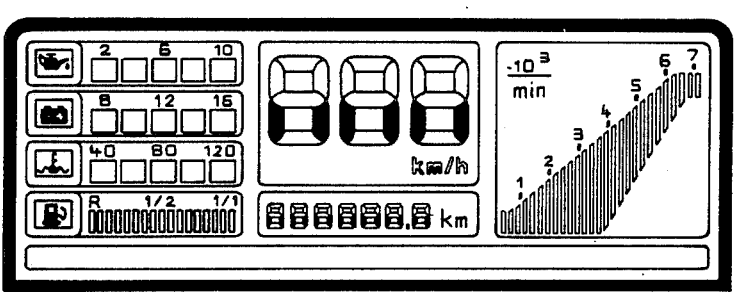

After the examiner has checked this test picture, the feeler 34 is again activated briefly, whereby the second test picture, shown in FIG. 3c, is activated. Finally, the test picture 3d is produced by another activation of the feeler 34.

After the three said final-test phases for the depiction of proper segment activation have come to an end, the microcomputer, when the feeler 34 is again activated, does not send any further pulse to the watch-dog circuit 19. Thus, if the watch-dog circuit 19 is operating properly, a reset pulse is produced after a short time, as a result of which this switch arrangement is simultaneously checked.

If the ground connection of the pin 39 is opened by the switch 33, then the normal manner of operation of the combination instrument is present, while otherwise the final testing again commences. If the microcomputer passes from the final-test operation mode to the normal operating mode, the speedometer, the odometer and the rpm meter can be checked by feeding distance pulses and rpm pulses from the testing device. The test is then concluded. If the watch-dog circuit and reset-circuit on the other hand are not in order, the third display test picture shown in FIG. 3d continues to be displayed until the voltage supply of the combination instrument is disconnected.

Figure 4:
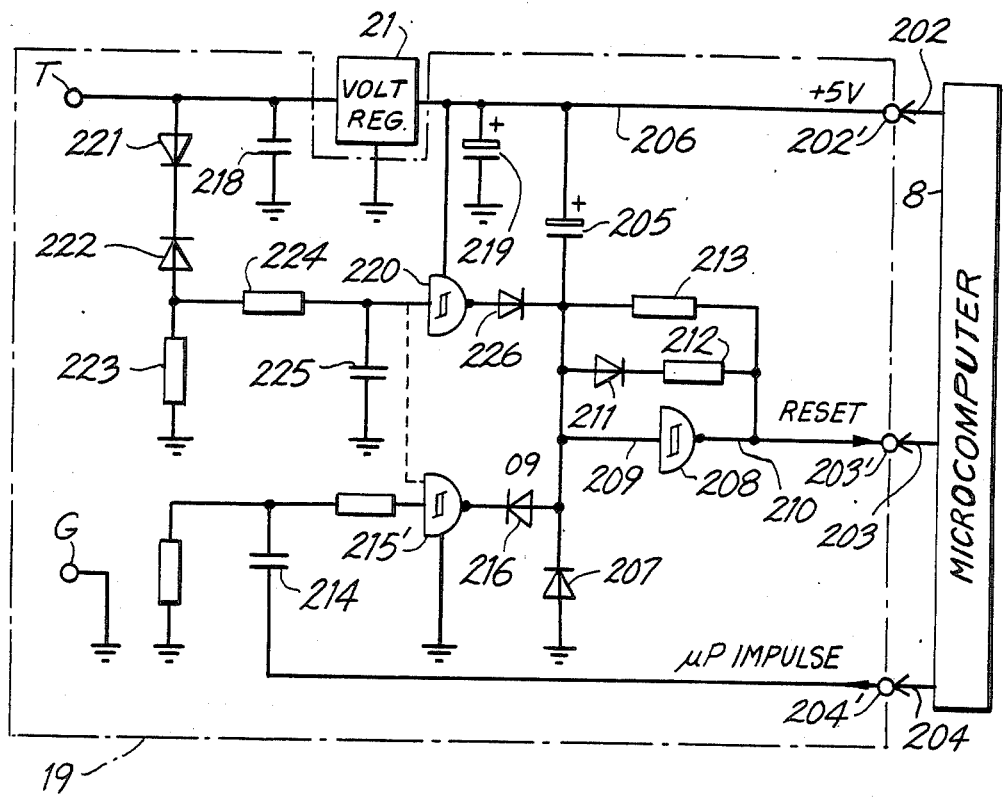
FIGS. 4 and 5 show a circuit and timing diagram of a watch-dog monitoring unit.
Figure 5:
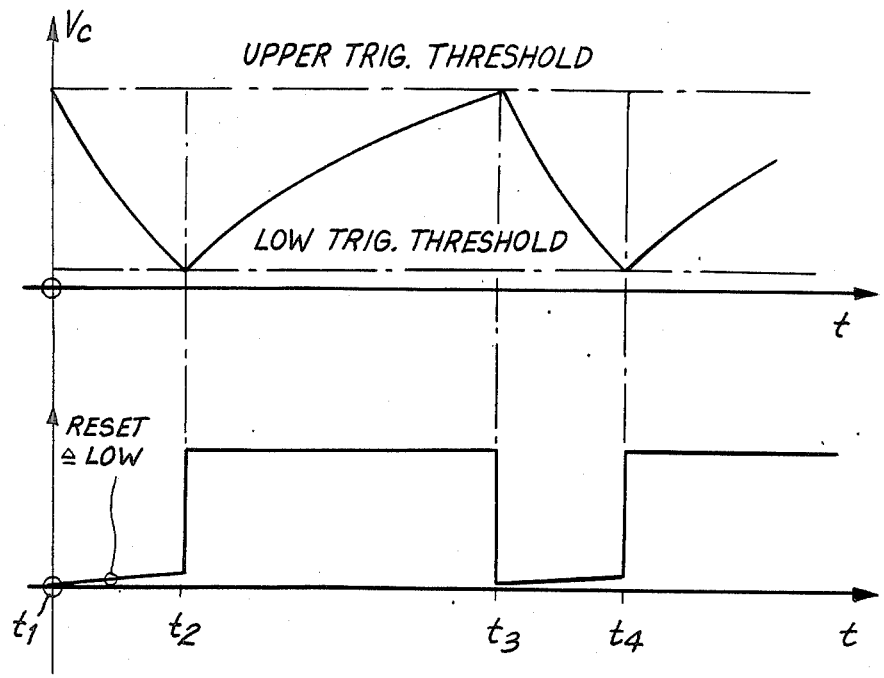

With reference to FIGS. 4 and 5, there is now provided a description of the construction and operation of a monitoring circuit 19.

The microcomputer 8, which may also be a microprocessor, has a terminal 202 for the feeding of a stabilized operating voltage, a terminal 203 for the feeding of a reset pulse by which the microcomputer can be reset in case of a disturbance in the program, as well as a terminal 204 at which microcomputer pulses appear in case of undisturbed execution of the program in the microcomputer. These terminals are intended for connection to corresponding terminals 202', 203' and 204' of a monitoring circuit arrangement, over which terminals the stabilized operating voltage is given off, a reset pulse is fed into the microcomputer in case of a malfunction and the microcomputer pulses are transmitted in order to check the proper execution of the program.

The heart of the monitoring circuit is a single time-determining capacitor 205 which is connected on one side to the +5 V line 206 of the regulated operating voltage and on the other side to ground via a diode 207. The diode 207 is so biased that the capacitor 205 is briefly discharged in the event of a glitch in the regulated operating voltage on the line 206.

In this and other cases of malfunction, a reset signal is given off to the terminal 203' by a first Schmitt trigger 208, the input 209 of which is connected to the time-determining capacitor 205.

In a negative feedback branch between the input 209 and an output 210 of the Schmitt trigger there is a series connection of a diode 211 with a relatively low-ohmic resistor 212 used for establishing a discharge time for the capacitor 205. The diode 211 is so biased that the capacitor 205 is charged at the low output level of the Schmitt trigger 208—low signal. In parallel with the series connection consisting of the diode 211 and the resistor 212, there is a second resistor 213 contained in a negative feedback branch. The second resistor 213 is of relatively high-ohmic value as compared with the first resistor 213, and is also used for establishing a discharge time for the capacitor 205. The capacitor 205 discharges via the resistor 213 when the output potential at the output 210 is high.

Thus, two time constants are formed with the capacitor 205, namely, with the relatively high ohmic resistor 213 a relatively long time interval within which microcomputer pulses are to occur when the microcomputer is functioning properly, and with the relatively low-ohmic resistor 212, the period of time of a reset pulse, which is relatively brief as compared with said interval.

The Schmitt trigger 208 with its negative feedback elements 211–213 and the capacitor 205 acts, as will be described further below, as an astable multivibrator and oscillates as long as no microcomputer pulses are present at the terminal 204′.

The microcomputer pulses are fed, via a coupling capacitor 214, into a second Schmitt trigger 215′. The output of the second Schmitt trigger 215 is connected via another diode 216 to the input 209 of the first Schmitt trigger and to the capacitor 205. The diode 216 is so biased that the capacitor 205 is briefly charged via the diode 216 when a positive microprocessor pulse occurs. (All of the Schmitt triggers are of inverting action).

Therefore, by the second Schmitt trigger 215, the first Schmitt trigger 208 is triggered into a given condition upon the occurrence of a positive microcomputer pulse which marks the start of the predetermined time interval within the next microcomputer pulse is to occur when the microcomputer is operating properly.

The operating voltage, particularly the voltage of the electrical system of an automobile, is present at the terminals T and G. The voltage is regulated by means of the regulator 21 connected between the terminal T and the line 206. A capacitor 218 serves as input protection and another capacitor 219 is provided as a filter.

The unregulated operating voltage at the terminal T is applied to a third Schmitt trigger 220 via a protective diode 221, a voltage-reducing zener diode 222 which includes a small resistor 223, and a series resistor 224. Any noise pulses which may be present are suppressed by the capacitor 225. The output of the third Schmitt trigger 220 is connected to the time-determining capacitor 205 and to the input 209 of the first Schmitt trigger 208 by a diode 226 which is biased in such a manner that the capacitor 205 is discharged when the operating voltage at the terminal T is too low and the output of the third inverting Schmitt trigger 220 assumes a high potential. A continuous reset signal is produced in this connection by the first Schmitt trigger 208.

When a voltage within the normal voltage range is applied to the terminal T, the regulated positive operating voltage potential is present at the capacitor 205 and the input 209 of the first Schmitt trigger 208; see capacitor voltage $V_c$ at the time $t_1$ in FIG. 5. Since the output 210 of the inverting Schmitt trigger in this case has a low potential, the capacitor 205 is charged via the diode 211 and the time-determining resistor 212 until the time $t_2$. Here the potential at the input 209 reaches a lower trigger threshold, which is shown by a dashed line in FIG. 5. Between $t_1$ and $t_2$ a reset pulse which is characterized by low potential (Low) is present at the terminal 203′. As from the time $t_2$ the reset pulse terminates and the capacitor 205 is discharged over the second time-determining resistor 213 since the output 210 is at high potential. This process continues, if no microcomputer pulse appears at the terminal 204′, until the time $t_3$ when the upper trigger threshold, which is also represented by a dashed line, has been reached. The interval between $t_2$ and $t_3$ represents the period of time during which a microcomputer pulse should occur in the microcomputer if the program is being executed properly. If this is not the case, for the reason that a malfunction is present, then the Schmitt trigger 208, when the upper trigger threshold is reached, automatically switches itself so that its output potential decreases and marks the start of a reset pulse in order to bring the microcomputer into a suitable starting position. At the same time, the capacitor 205 is again charged over the diode 211 and the resistor 212, which thus determines the duration of the reset pulse up to the time $t_4$.

While the drawing is not shown to scale, the interval between two reset pulses which occur cyclically—in the absence of microcomputer pulses—is typically twenty times longer than the duration of the reset pulse.

If, with the microcomputer operating properly, a positive microcomputer pulse occurs in the interval of predetermined duration, for instance between the times $t_2$ and $t_3$, then the time-determining capacitor 205 is charged practically immediately via the bulk resistance of the Schmitt trigger, developed as CMOS-gate, as though the capacitor 205 were connected to ground. This means that, for instance, at $t_2$ the time interval commences within which, if the microcomputer is operating properly, a microcomputer pulse must again occur so that no reset pulse be given off.

The functions of monitoring the unstabilized operating voltage at the terminal T and the stabilized operating voltage on the line 206 which have been described are so superimposed upon the functions described for monitoring the execution of the program that, in the event of disturbances in voltage, a continuous reset signal is produced and is maintained for the duration of the malfunction.

I claim:

1. In an electric testing device or vehicle combination instrument which combination instrument comprises display means made of segments, a display control coupled to the display means and including a microcomputer for activating the segments as a function of measured values, an analog-digital converter arranged in front of the display control for analog input signals, and an optional input network arranged in front of the converter, the improvement of the testing device wherein
in the microcomputer of the display control, there is for each measurement value a range of tolerance value of a critical display value stored 2 which tolerance value is compared by said microcomputer, in a first final-test phase of a manually controllable final-test operating mode, with a simulated measurement value; and wherein the simulated measurement value is feedable into the microcomputer via the analog-digital converter; a display value which represents the result of the comparison is stored in the microcomputer and is transferable to the display means as a function of the result of the comparison; and by the display control, fixed, predetermined segment combinations are actuatable one after the other in other manually controllable final-test phases in the test operating mode; and wherein said testing device further comprises
equivalent resistors which simulate the measurement value and wherein said testing device further comprises switches which serves to call up the final-test operating mode and for further connection of the final-test phases.

2. The device according to claim 1, wherein the testing device further comprises pulse generators for simulating odometer pulses and rpm pulses, which odometer pulses and rpm pulses are fed in the microcomputer for the testing of an odometer display and a tachometer display in the normal operating mode of the combination instrument.

3. The device according to claim 2, further comprising a monitoring circuit, and wherein the microcomputer together with the monitoring circuit switches from the final-test operating mode to normal operating mode after a predetermined number of final-test phases so that the testing of the odometer display and of the tachometer display then takes place.

4. The device according to claim 1, wherein at least one display value which represents the result of the comparison is repesented as a number on the display means for the speed display.

5. The device according to claim 4, wherein a number of display values, which represent all comparison results obtained during a final-test phase, is represented as a sum on said display means.

6. The device according to claim 1, further comprising a monitoring circuit, and wherein the microcomputer together with the monitoring circuit switches from the final-test operating mode to normal operating mode after a predetermined number of final-test phases so that the testing of an odometer display and of a tachometer display then takes place.

7. The device according to claim 1, wherein a number of display values, which represent all comparison results obtained during a final-test phase, is represented as a sum on said display means.

8. In an electric testing device for vehicle combination instrument which combination instrument comprises display means made of segments, a display control coupled to the display means and including a microcomputer for activating the segments as a function of measured values, an analog-digital converter arranged in front of the display control for analog input signals, and an optional input network arranged in front of the converter, the improvement of the testing device wherein in the microcomputer of the display control, there is for each measurement value a range of tolerance value of a critical display value stored; which tolerance value is compared by said microcomputer, in a first final-test phase of a manually controllable final-test operating mode, with a simulated measurement value; a wherein the simulated measurement value is feedable into the microcomputer via the analog-digital converter; a display value which represents the result of the comparison is stored in the microcomputer and is transferable to the display means as a function of the result of the comparison; and by the display control, fixed, predetermined segment combinations are actuatable one after the other in other manually controllable final-test phases in the test operating mode; a wherein said testing device further comprises equivalent resistors which simulate the measurement value and wherein said testing device further comprises switches which serve to call up the final-test operating mode and for further connection of the final-test phases; and a matching network connected to an input terminal of said analog-digital converter for matching input signals to said converter.

9. The device according to claim 5, wherein said matching network is a resistance network.

* * * * *